United States Patent
Francis et al.

(10) Patent No.: US 10,673,424 B1
(45) Date of Patent: Jun. 2, 2020

(54) SWITCH LEAKAGE COMPENSATION CIRCUITS

(71) Applicant: Xilinx, Inc., San Jose, CA (US)

(72) Inventors: Roswald Francis, Dublin (IE); Christophe Erdmann, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/388,786

(22) Filed: Apr. 18, 2019

(51) Int. Cl.
*H03K 5/13* (2014.01)
*H03M 1/08* (2006.01)
*H03K 5/00* (2006.01)

(52) U.S. Cl.
CPC .............. *H03K 5/13* (2013.01); *H03M 1/08* (2013.01); *H03K 2005/00195* (2013.01)

(58) Field of Classification Search
CPC .......... H03K 5/13; H03K 2005/00195; H03K 2005/0028; H03M 1/08
USPC ........................................................ 327/281
See application file for complete search history.

(56) References Cited

U.S. PATENT DOCUMENTS

| | | | | |
|---|---|---|---|---|
| 6,229,367 B1 * | 5/2001 | Choudhury | .............. | H03K 5/13 327/269 |
| 7,978,111 B2 * | 7/2011 | Sun | ....................... | G04F 10/005 341/155 |
| 8,624,629 B2 * | 1/2014 | Shin | ....................... | H03K 5/131 327/270 |
| 8,902,094 B1 | 12/2014 | Zhang et al. | | |
| 10,263,475 B2 * | 4/2019 | Zargham | .................. | H02J 5/005 |
| 2004/0095209 A1 * | 5/2004 | Mori | .................. | H03H 11/1291 333/174 |
| 2008/0253052 A1 * | 10/2008 | Crewson | ................... | H03K 3/57 361/98 |
| 2015/0280699 A1 * | 10/2015 | Sakurai | ..................... | H03K 5/13 327/237 |
| 2018/0302070 A1 * | 10/2018 | Parvizi | ..................... | H03K 5/13 |

OTHER PUBLICATIONS

Ribeiro, Joao Pedro Viegas Lopes, High Data Rate ADC for Communication Systems, n.d., 9 pages, Lisboa, Portugal.
Harris, Jonathan, The ABCs of interleaved ADCs, EDN Network, Feb. 17, 2013, 7 pages.

* cited by examiner

*Primary Examiner* — Ryan Jager
(74) *Attorney, Agent, or Firm* — Craige Thompson; Thompson Patent Law

(57) ABSTRACT

Apparatus and associated methods relating to a switch leakage compensation delay circuit include a compensating transistor configured to passively bypass a leakage current around a capacitor that connects in series with a control transistor. In an illustrative example, the capacitor and the compensating transistor may be connected in parallel between a first node and a second node. The compensating transistor gate may be tied, for example, directly to its source and to the second node. The control transistor may connect its drain to the second node. When a control signal turns off the control transistor, a leakage current of the control transistor may be supplied from a leakage current of the compensating transistor such that the voltage across the capacitor may be maintained substantially constant. The delay circuit may advantageously mitigate the capacitor's voltage droop to reduce clock time skew, for example, in low speed interleaved ADC operation.

20 Claims, 11 Drawing Sheets

| Edge | Min(fs) | Max(fs) | Mean(fs) | Median(fs) | Std Dev(fs) |
|---|---|---|---|---|---|
| Sampling Start | 5.585 | 10.08 | 7.658 | 7.618 | 0.953 |
| Sampling End | -1.512 | 21.79 | 8.127 | 8.651 | 4.789 |

FIG. 6A

| Edge | Min(fs) | Max(fs) | Mean(fs) | Median(fs) | Std Dev(fs) |
|---|---|---|---|---|---|
| Sampling Start | 4.944 | 9.792 | 7.007 | 7.015 | 0.768 |
| Sampling End | 4.961 | 11.43 | 7.733 | 7.703 | 1.2 |

FIG. 6B

SWITCH LEAKAGE COMPENSATION CIRCUITS

TECHNICAL FIELD

Various embodiments relate generally to switch leakage compensation.

BACKGROUND

Data represents information that has useful value. Data can take the form of stored information. Data storage can be in analog form. Data storage can also be in digital form.

Data in digital format may be communicated between two nodes. At a receiver in a digital communication system, a digitally-encoded data stream may be received as an analog signal and converted to a digital format by an analog-to-digital converter (ADC). The ADC interprets the data stream as a function of time. For example, some ADCs may be synchronized to a clock signal that determines when a voltage signal is to be sampled. Accurate recovery of a stream of digital data, for example, may depend on accurate clock timing. In some implementations, timing of a clock signal may determine whether a symbol in a data stream is interpreted, for example, as a one or as a zero. Sometimes, a clock signal is received, but its phase information may be uncertain. To enhance data accuracy and data integrity, various clock signal phase alignment operations may sometimes be performed before launching data or upon receiving data so that accurate clock phase information may be supplied to the ADC.

In integrated circuit applications, ADCs may typically perform critical timing functions using one or more circuit stages that are implemented with transistors. In various ADC circuits, some of the transistors may operate in a linear mode to process analog signals. In some ADC circuits, certain transistors may be designed to operate as ideal switches (e.g., digital signals). An ideal transistor switch may operate in either an on state or an off state in response to a control signal. In practice, however, transistors in real integrated circuits may exhibit non-ideal behavior related to intrinsic device properties and/or extrinsic parameters such as, for example, device process parameters, applied voltage, and device temperature.

SUMMARY

Apparatus and associated methods relating to a switch leakage compensation delay circuit include a compensating transistor configured to passively bypass a leakage current around a capacitor that connects in series with a control transistor. In an illustrative example, the capacitor and the compensating transistor may be connected in parallel between a first node and a second node. The compensating transistor gate may be tied, for example, directly to its source and to the second node. The control transistor may connect its drain to the second node. When a control signal turns off the control transistor, a leakage current of the control transistor may be supplied from a leakage current of the compensating transistor such that the voltage across the capacitor may be maintained substantially constant. The delay circuit may advantageously mitigate the capacitor's voltage droop to reduce clock time skew, for example, in low speed interleaved ADC operation.

Various embodiments may achieve one or more advantages. For example, a MOS capacitor may advantageously decrease fabrication steps and area of the delay circuit. The same size and type of transistor as the switch may compensate the leakage provided by the switch across process, voltage, and temperature. In some embodiments, the spatial position of the transistor may be made slightly higher than the switch to reduce the negative impact on area. By introducing the switch leakage compensation delay circuit, some embodiments may enable the time skew DAC to be used across large clock frequency ranges as the leakage problem is a big constraint for large clock frequency range application. Some embodiments may enable the ADC to work across frequency, process, voltage, temperature (PVT) and mismatch without any demerits. Some embodiments may be flexibly employed, for example, in programmable logic, such as a field programmable gate array (FPGA) that may permit the delay circuit to be reconfigurable to the field. In some embodiments, cost, size or power may be reduced, for example, when implemented on a fixed hardware platform, such as an application-specific integrated circuit (ASIC).

In one exemplary aspect, a delay circuit is configured to obtain a predetermined delay. The delay circuit includes a capacitor coupled between a first node and a second node. The delay circuit also includes a first transistor. The drain of the first transistor is connected to the second node, the source of the first transistor is connected to a reference node, and the gate of the first transistor is coupled to a first gate control signal. The first transistor modulates connectivity between the first drain and the first source in response to the first gate control signal. The delay circuit also includes a second transistor with the drain and the source coupled in parallel with the capacitor and the gate coupled to apply less than a second threshold voltage of the second transistor to the second gate. When in a first mode, the first gate control signal applies less than a first threshold voltage of the first transistor to the first gate, the voltage across the capacitor is substantially constant.

In some embodiments, in the first mode, the first transistor may provide a first leakage current $I_{leak1}$ that substantially matches a second leakage current $I_{leak2}$ provided by the second transistor. The second drain may be connected to the first node, and the second source may be connected to the second gate and to the second node. The second transistor may be on the same die and have substantially the same dimension as the first transistor. The first transistor may be an n-channel metal-oxide-semiconductor field-effect transistor (NMOSFET) or a p-channel metal-oxide-semiconductor field-effect transistor (PMOSFET). The first transistor may also be a transmission gate. In some embodiments, the second transistor may be an n-channel metal-oxide-semiconductor field-effect transistor (NMOSFET). The capacitor may be a metal-oxide-semiconductor transistor. In some embodiments, a potential of the reference node may be a circuit ground potential. The second gate of the second transistor may be connected to the second node.

In another exemplary aspect, a system includes a buffer output coupled to drive a first node conducting a predetermined delay on an input clock signal. The system also includes at least one delay circuit configured to obtain the predetermined delay. Each of the at least one delay circuits includes a capacitor coupled between a first node and a second node. Each of the at least one delay circuits also includes a first transistor with the drain connected to the second node, the source connected to a reference node, and the gate coupled to a first gate control signal. The first transistor modulates connectivity between the first drain and the first source in response to the first gate control signal. Each of the at least one delay circuits also includes a second transistor with the drain and the source coupled in parallel with the capacitor and the gate coupled to apply less than a second threshold voltage of the second transistor to the gate of the second transistor. In a first mode, when the first gate control signal applies less than a first threshold voltage of the first transistor to the first gate, the voltage across the capacitor is substantially constant.

In some embodiments, in the first mode, the first transistor may provide a first leakage current $I_{leak1}$ that substantially matches a second leakage current $I_{leak2}$ provided by the second transistor. The second transistor may be on the same die and have the same dimension as the first transistor. The first transistor may be a NMOSFET or a PMOSFET. The first transistor may also be a transmission gate. The second transistor may be a NMOSFET. The capacitor may be a metal-oxide-semiconductor transistor. In some embodiments, a potential of the reference node may be a circuit ground potential. In some embodiments, the gate of the second transistor may be connected to the second node.

In another exemplary aspect, a method includes providing a capacitor coupled between a first node and a second node, and providing a capacitor coupled between a first node and a second node. The method further includes providing a first transistor with a first drain connected to the second node, a first source connected to a reference node, and a first gate coupled to a first gate control signal, wherein the first transistor modulates connectivity between the first drain and the first source in response to the first gate control signal. The method also includes providing a second transistor with a second drain and a second source coupled in parallel with the capacitor and a second gate coupled to apply less than a second threshold voltage of the second transistor to the second gate. In addition, the method further includes, in a first mode when the first gate control signal applies less than a first threshold voltage of the first transistor to the first gate, supplying, with the second transistor, substantially a first leakage current $I_{leak1}$ drawn by the first transistor such that a voltage across the capacitor is maintained substantially constant.

In some embodiments, in the first mode, the second transistor may substantially match the first leakage current $I_{leak1}$. The second drain may be connected to the first node, and the second source may be connected to the second gate and to the second node. A potential of the reference node may be a circuit ground potential. The second gate may be connected to the second node.

The details of various embodiments are set forth in the accompanying drawings and the description below. Other features and advantages will be apparent from the description and drawings, and from the claims.

BRIEF DESCRIPTION OF THE DRAWINGS

FIG. 6A depicts an exemplary simulation result of the delay circuit in FIG. 3C.

FIG. 6B depicts an exemplary simulation result of the switch leakage compensation delay circuit in FIG. 4C.

Like reference symbols in the various drawings indicate like elements.

DETAILED DESCRIPTION OF ILLUSTRATIVE EMBODIMENTS

Apparatus and associated methods relating to a switch leakage compensation delay circuit include a compensating transistor configured to passively bypass a leakage current around a capacitor that connects in series with a control transistor. In an illustrative example, the capacitor and the compensating transistor may be connected in parallel between a first node and a second node. The compensating transistor gate may be tied, for example, directly to its source and to the second node. The control transistor may connect its drain to the second node. When a control signal turns off the control transistor, a leakage current of the control transistor may be supplied from a leakage current of the compensating transistor such that the voltage across the capacitor may be maintained substantially constant. The delay circuit, such as the exemplary delay circuit 405a described with reference to FIG. 4A, may advantageously mitigate the capacitor's voltage droop to reduce clock time skew, for example, in low speed interleaved ADC operation.

To aid understanding, this document is organized as follows. First, an exemplary platform (e.g., FPGA) suitable to perform analog-to-digital conversion is briefly introduced with reference to FIG. 1. Second, with reference to FIGS. 2-4C, the discussion turns to introduce how exemplary circuits may be used to introduce a predetermined delay and compensate a leakage current provided by a switch. Then, with reference to FIG. 5A and FIG. 6B, the discussion discloses exemplary experimental results and simulation results of the exemplary circuits. Finally, with reference to FIG. 7, an exemplary method to perform switch leakage compensation is discussed. By using the delay circuit, leakage current may be compensated and time skew digital-to-analog converter (DAC) functionality at low speeds may be advantageously solved.

Figure 1:
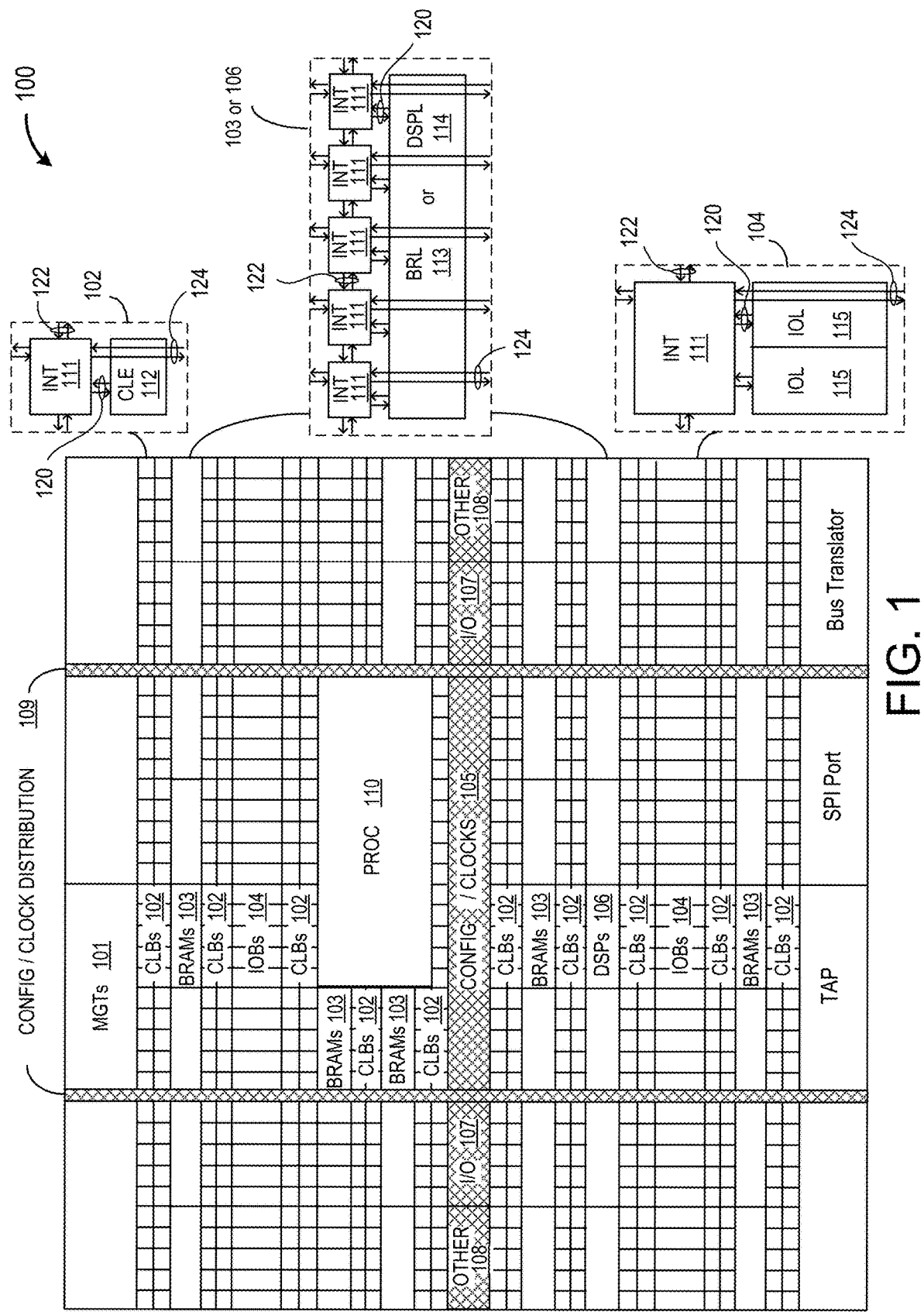
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

At least one transceiver may be embedded in the FPGA to perform data transmitting and data receiving during communication. Analog-to-digital conversion is the process of converting a continuous range of analog signal levels into digital codes. Analog signal levels can be converted into digital voltages, digital currents or digital charge signals using an ADC. ADCs may be used in many applications, for example, communication systems. Switches and capacitors may be used in ADCs to control the sampling of the ADC. A switch leakage compensation circuit may be used to compensate the leakage current introduced by switches and advantageously maintain the accuracy of the conversion.

Figure 2:
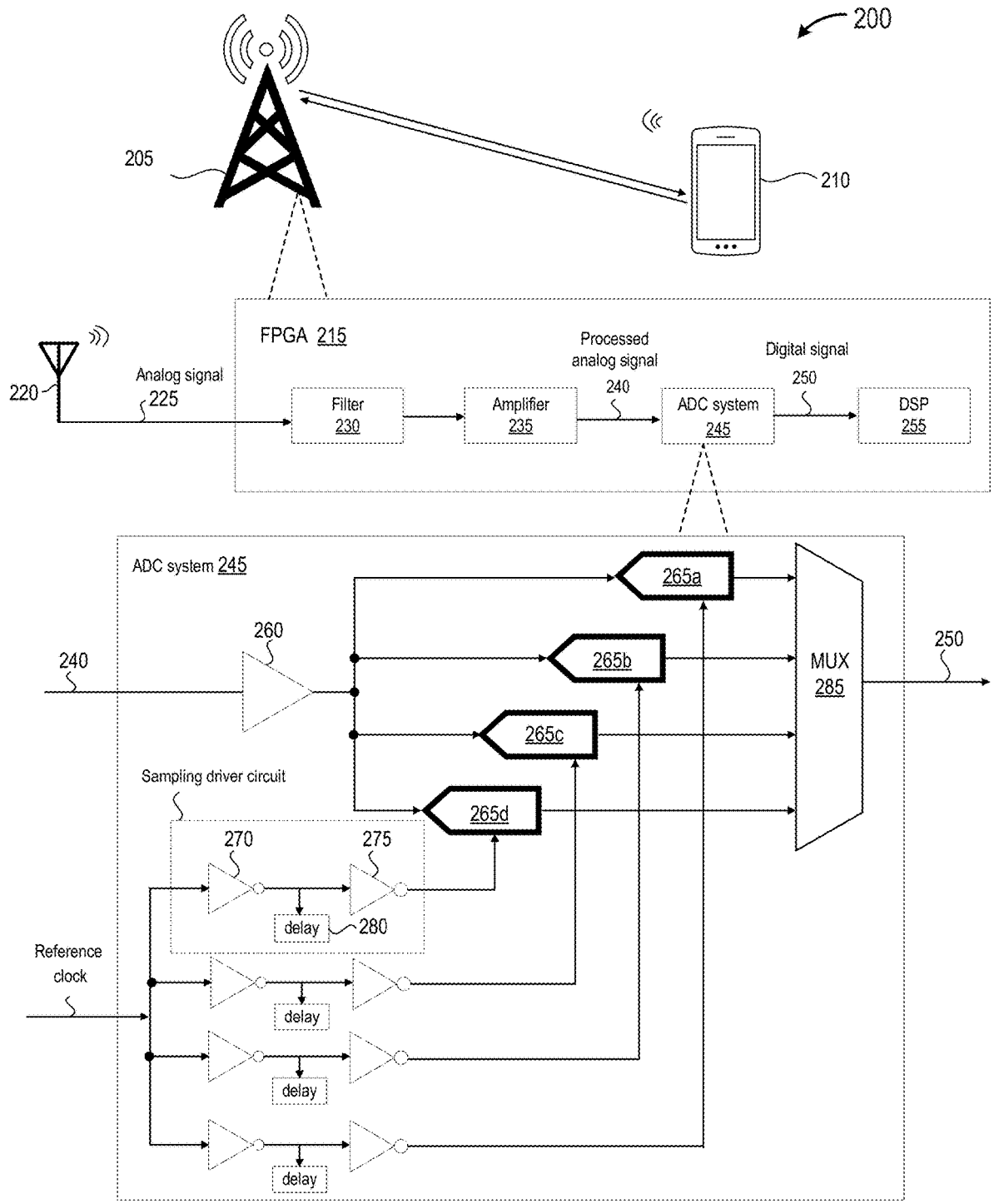
FIG. 2 depicts an exemplary interleaving analog-to-digital converter (ADC) with a switch leakage compensation delay system.

FIG. 2 depicts an exemplary interleaving analog-to-digital converter (ADC) with a switch leakage compensation delay system. A communication system 200 includes a base station 205. The base station 205 may be used to transmit and receive data from some data communication devices. In this exemplary example, the base station 205 receives analog signals from a cell phone 210. The base station 205 includes an FPGA 215 to perform data communication through an antenna 220 between the base station 205 and the cell phone 210. The antenna 220 transfers a received analog signal 225 to a filter 230. The filter 230 filters errors and/or noises in the analog signal 225. The filtered analog signal is amplified by an amplifier 235 to generate a processed analog signal 240. The processed analog signal 240 is converted to a digital signal 250 through an analog-to-digital converter (ADC) system 245. The digital signal 250 is then processed by a digital signal processor (DSP) 255, for example.

High-speed electronics (e.g., 5G technologies) may require ADCs of high sampling rate. For example, a receiver may utilize a 5-Gigasamples-per-second (GSPS) ADC, with a 1-GHz, DC-coupled, fully differential amplifier front end. Each signal may be sampled at 200 ps. Time-interleaving ADCs may be used to achieve the high sampling rate. For example, by using a time-interleaved ADC that includes four sub-ADCs, each of the four sub-ADCs may only need to have a sampling rate that is 1.25 GSPS, for example.

In this depicted example, the processed analog signal 240 is received by a buffer 260 and is then sampled by four sub-ADCs 265a, 265b, 265c, 265d. For example, a first sample may be sampled by a first ADC 265a. Each of the four sub-ADCs 265a, 265b, 265c, 265d is driven by a sampling driver circuit. Each of the sampling driver circuits generates a different sampling clock signal. For example, a first sampling clock signal used by the first sub-ADC 265a may have 0-degree phase difference compared to a reference clock signal. The second sampling clock signal used by the second sub-ADC 265b may have a 90-degree phase difference compared to the reference clock signal. The third sampling clock signal used by the third sub-ADC 265c may have a 180-degree phase difference compared to the reference clock signal. The fourth sampling clock signal used by the fourth sub-ADC 265d may have a 270-degree phase difference compared to the reference clock signal.

Each of the sub-ADCs 265a, 265b, 265c, 265d may sample at the exact time (e.g., the first sub-ADC 265a may sample at 0s, the second sub-ADC 265b may sample at 800 ps, the third sub-ADC 265c may sample at 1600 ps, and the fourth sub-ADC 265d may sample at 2400 ps). Due to fabrication or technique limitations, electrical characteristics of each of the sub-ADCs may vary. Mismatch of the sub-ADCs may generate harmonic spur and interleaving spur. For example, the first sub-ADC 265a may sample at 800 ps±10 fs. Even for a small number like 10 fs may lead to a time skew, especially when the highest intermediate frequency of interest is in the GHz range with a tight specification on interleaving tones. In this depicted example, each of the sampling driver circuits includes a first buffer (e.g., an inverter) 270 and a second buffer (e.g., an inverter) 275 to preserve the phase of the sampling signal. Between the first buffer 270 and the second buffer 275, a switch leakage compensation delay system 280 is arranged to introduce a predetermined delay on the inverted processed analog signal to solve the time skew problem. An example of the switch leakage compensation delay system 280 is described in further detail with reference to FIG. 4A-4C.

Each of the sub-ADCs 265a, 265b, 265c, 265d connects with a selection circuit 285 (e.g., a multiplexer). The selection circuit 285 selectively outputs the signals sampled by the four sub-ADCs 265a, 265b, 265c, 265d to form the digital signal 250.

Figure 3A:
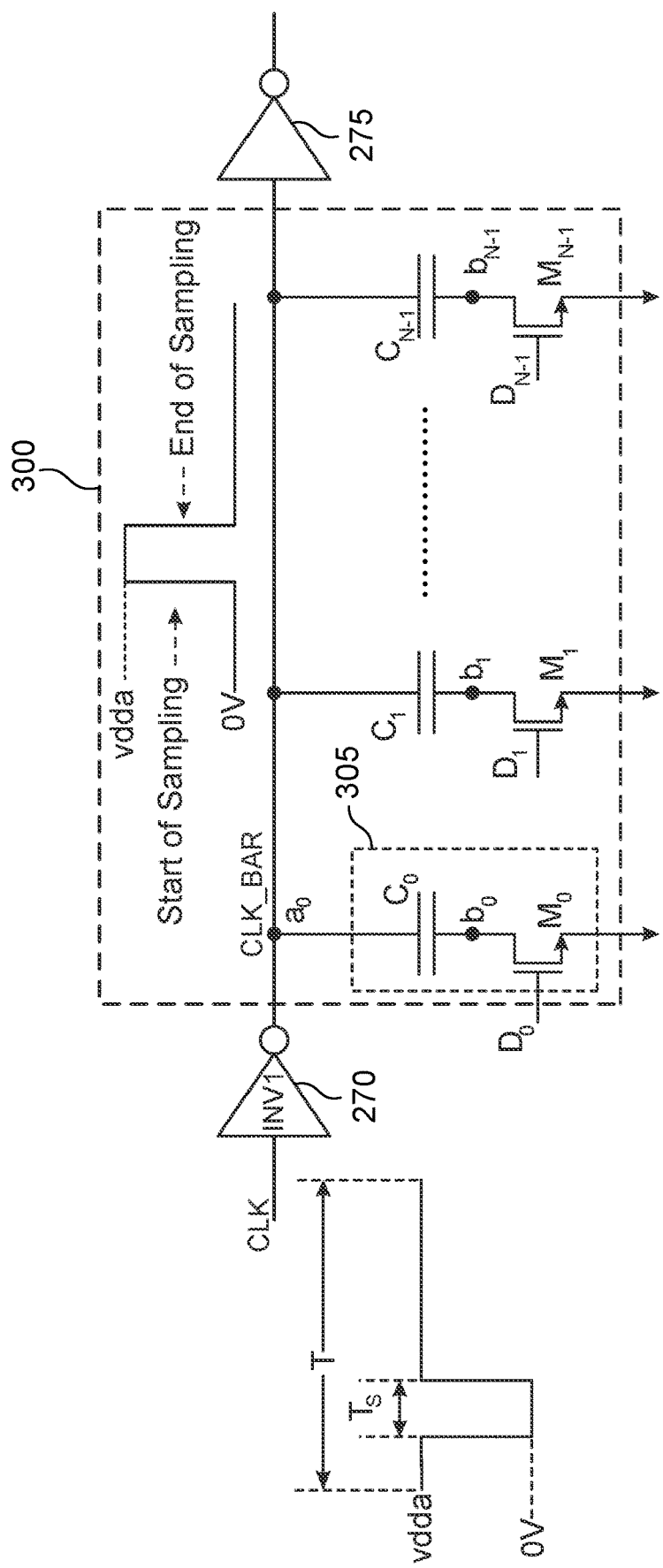
FIG. 3A depicts a delay system used for the interleaving ADC.

FIG. 3A depicts a prior art delay system used for the interleaving ADC. In the prior art, a delay system 300 is arranged between the first buffer 270 and the second buffer 275. The delay system 300 includes one or more delay circuits 305 connected in parallel. For example, a first delay circuit 305 includes a first capacitor $C_0$ arranged to introduce a delay on an incoming sampling clock signal. In some embodiments, the capacitor $C_0$ may be a MOS capacitor. The other end of the capacitor $C_0$ is connected with a first switch $M_0$ through a node $b_0$. The first switch $M_0$ is controlled by a control signal $D_0$. In this depicted example, the switch $M_0$ includes an N-channel metal-oxide-semiconductor field-effect transistor (NMOSFET). The drain of the NMOSFET connects to the node $b_0$. The source of the NMOSFET connects to ground. The gate of the NMOSFET is controlled by the controlled signal $D_0$.

By closing or opening the switch of each delay circuit, the capacitor in the delay circuit may be added or not added to the circuit. The delay may be then programmed by controlling the control signal $D_0, D_1, \ldots, D_{N-1}$. A corresponding waveform at the node $b_0$ is illustrated. During sampling start CLK_BAR rising edge, the voltage at the node $b_0$ rises to $V_{dda}$. $V_{dda}$ (e.g., 0.9 v) is the power supply of the buffer 270 and the high level of the clock signal passing through the buffer 270 and buffer 275.

Figure 3B:
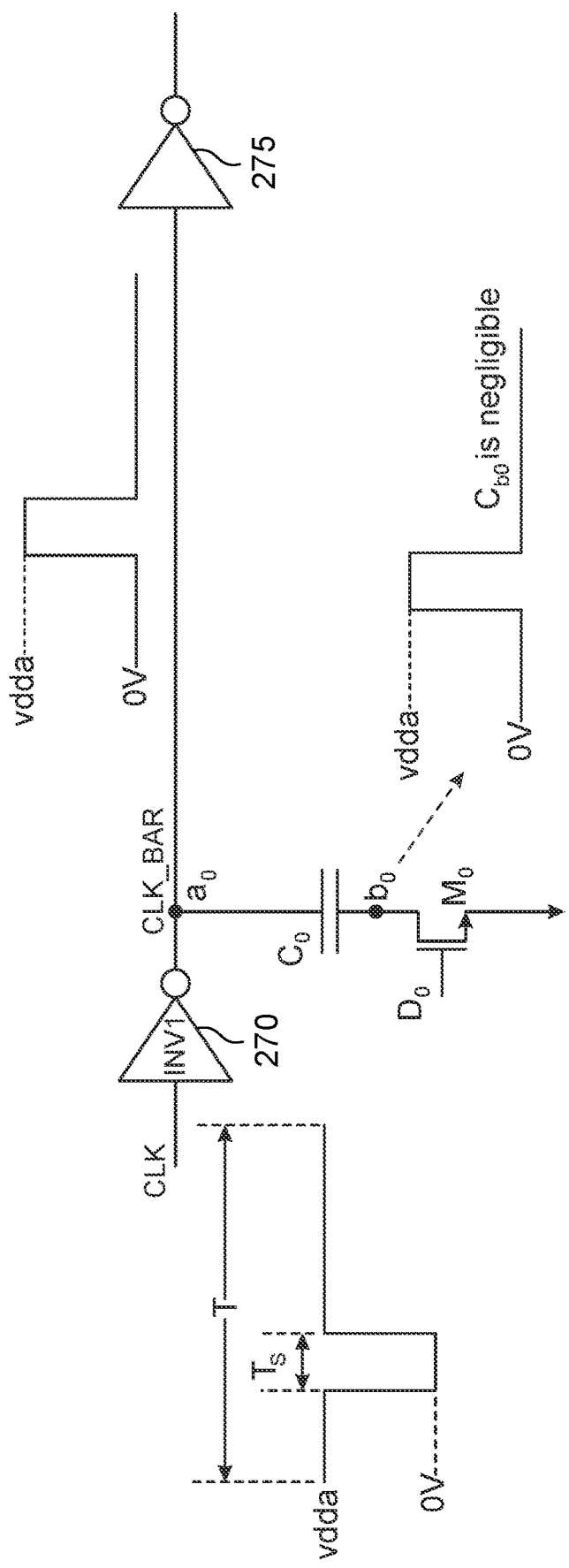
FIG. 3B depicts a prior art delay circuit when a switch in the delay circuit is off in an idealized model.

FIG. 3B depicts a prior art delay circuit when a switch in the delay circuit is off in an idealized model. In this depicted example, the first transistor $M_0$ has no leakage current and the parasitic capacitance $C_{b0}$ is negligible. A corresponding waveform at the second node $b_0$ is illustrated. When the transistor $M_0$ has no leakage current, the waveform of the sampling clock signal appears well-maintained.

Figure 3C:
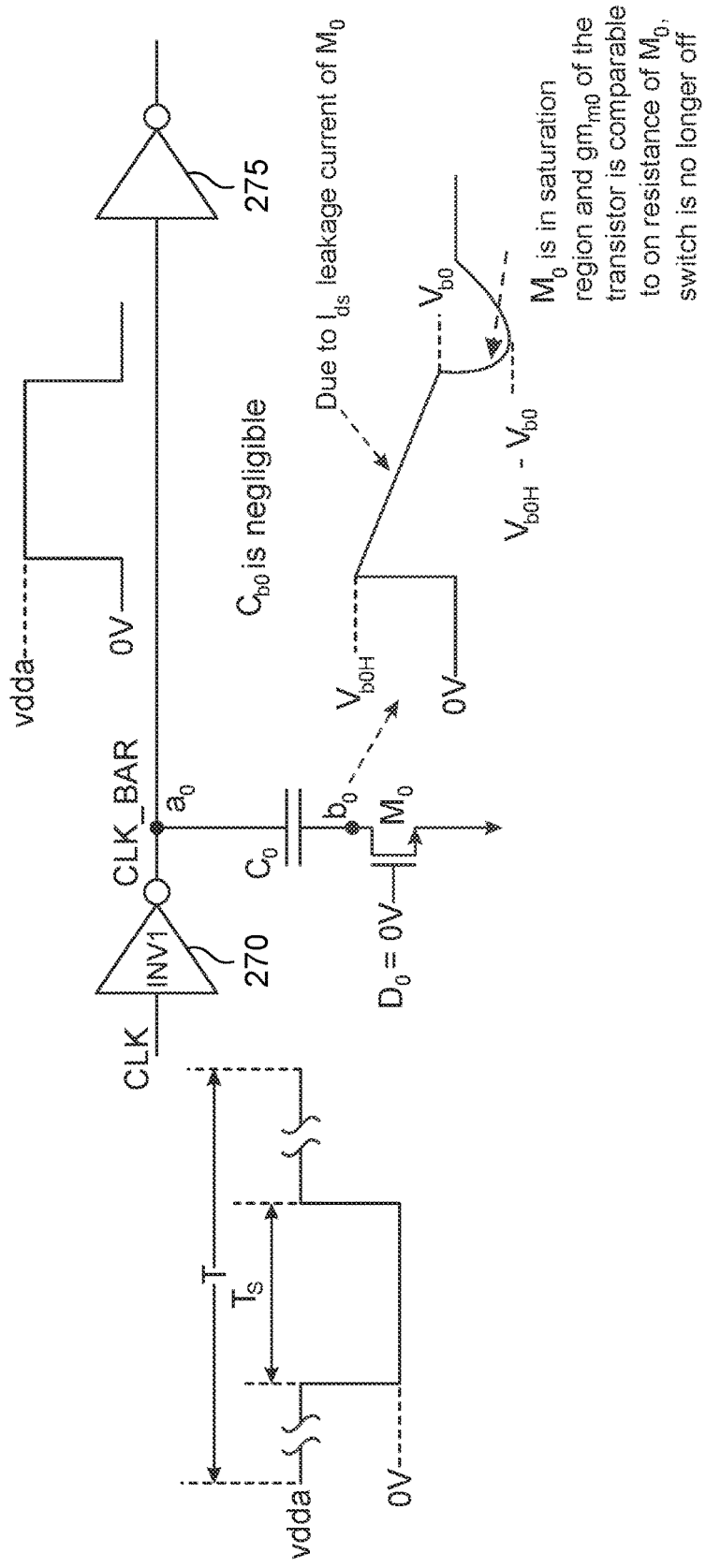
FIG. 3C depicts an exemplary time diagram of the delay circuit when the switch in the delay circuit is off and has leakage current associated with the switch.

FIG. 3C depicts an exemplary time diagram of the delay circuit when the switch in the delay circuit is off and has leakage current associated with the switch. In practice, the first transistor $M_0$ has a leakage current. When the transistor $M_0$ has a leakage current and the speed of the ADC is low, the waveform of the sampling clock signal is not an ideal sampling clock signal, since the leakage current may make the transistor $M_0$ no longer off even though the gate voltage of the transistor $M_0$ (e.g., an N-channel MOSFET) is 0V. The timing diagram reveals the undesired effects of capacitor voltage droop at the junction between the capacitor and the transistor $M_0$.

A corresponding waveform at the second node $b_0$ is illustrated. During sampling start CLK_BAR rising edge, the voltage at the second node $b_0$ doesn't rise to $V_{dda}$ due to the presence of $C_{b0}$. The voltage at the second node $b_0$ rise to $V_{b0H}$.

$V_{b0H} = (V_{dda} * C_0)/(C_0 + C_{b0})$. The leakage current may make the voltage at the second node $b_0$ leaked to zero. As shown in FIG. 3C, the transistor $M_0$ is not off during end of the sampling, which may affect time skew DAC functionality at low speeds. Due to negative voltage, the drain of $M_0$ becomes the source of $M_0$, and the source of $M_0$ becomes the drain of the $M_0$. Thus, the transistor $M_0$ may get into saturation mode from cut off mode. For example, the impedance between $b_0$ and ground may be $1/g_m$ of $M_0$, which may be a low value compared with the on resistance of $M_0$.

Figure 4A:
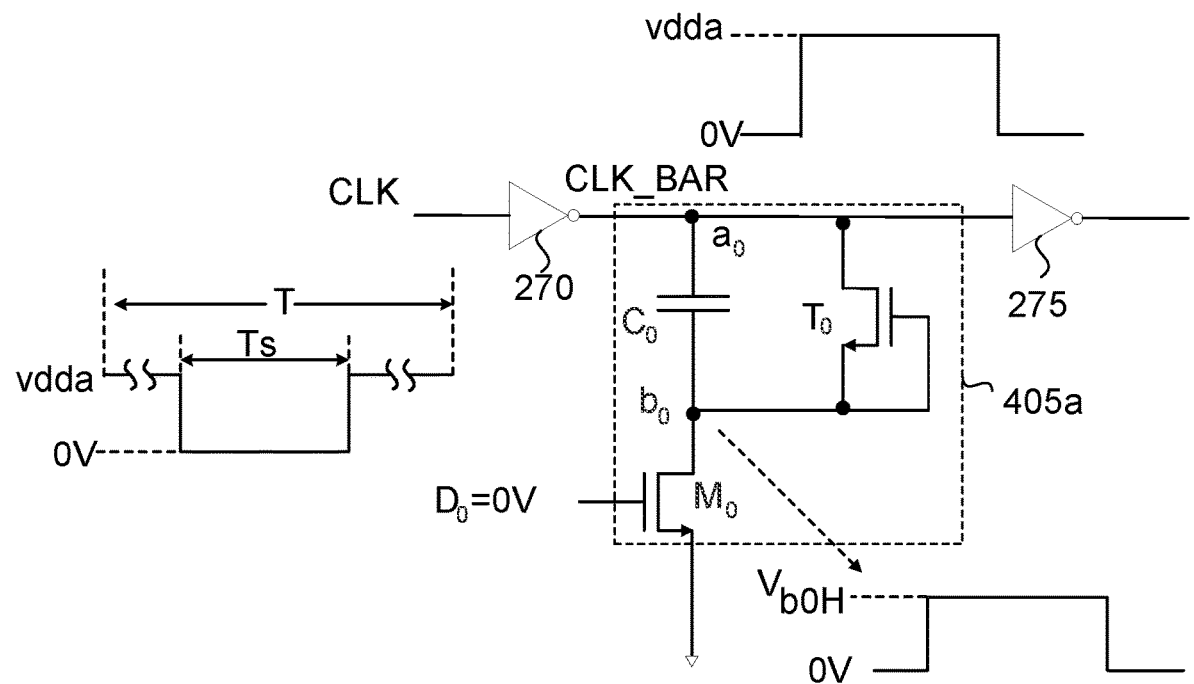
FIG. 4A depicts an exemplary switch leakage compensation delay circuit.

FIG. 4A depicts an exemplary switch leakage compensation delay circuit. A delay circuit 405a includes a first capacitor $C_0$. The first capacitor $C_0$ is arranged between a first node $a_0$ and a second node $b_0$. The first capacitor $C_0$ is used to introduce a predetermined delay on an incoming sampling clock signal through the first node $a_0$. In some embodiments, the capacitor $C_0$ may be a MOS capacitor for precision and lesser area.

The other end of the capacitor $C_0$ is connected with a first transistor $M_0$ through the second node $b_0$. In this depicted example, the transistor $M_0$ is an N-channel metal-oxide-semiconductor field-effect transistor (NMOSFET). The drain of the transistor $M_0$ connects to the second node $b_0$. The source of the transistor $M_0$ connects to a reference node (e.g., ground potential). The gate of the transistor $M_0$ is controlled by the controlled signal $D_0$. The transistor $M_0$ modulates connectivity between the drain and the source in response to the controlled signal $D_0$. When the voltage applied between the gate and source of the transistor $M_0$ is less than the threshold voltage $V_{T1}$ of the transistor $M_0$, due to subthreshold effect, the transistor $M_0$ provides a first leakage current $I_{leak1}$. As discussed in FIG. 3C, the first leakage current $I_{leak1}$ may lead to a time skew.

The delay circuit 405a also includes a second transistor $T_0$. In this depicted example, the second transistor $T_0$ is a NMOSFET. The second transistor $T_0$ is connected to the capacitor $C_0$ in parallel. The drain of the second transistor $T_0$ is coupled to the first node $a_0$. The source of the second transistor $T_0$ is coupled to the second node $b_0$. The gate of the second transistor $T_0$ is coupled to a voltage. When the voltage applied to the gate makes a voltage difference $V_{gs}$ between the gate and the source of the second transistor $T_0$ is less than the threshold voltage $V_{T2}$ of the second transistor $T_0$, the second transistor $T_0$ doesn't have a conducting path between the second source and the second drain. Due to subthreshold effect, the second transistor $T_0$ also introduces a second leakage current $I_{leak2}$. The second leakage current $I_{leak2}$ cancels and compensates the first leakage current $I_{leak1}$ which may make the voltage at the second node $b_0$ substantially constant with time.

In this depicted example, both the gate and the source of the second transistor $T_0$ are coupled to the second node $b_0$. By connecting the source and the gate, the voltage difference $V_{gs}$ between the source and the gate is 0, which is less than the threshold voltage $V_{T2}$ of the second transistor $T_0$. By connecting the source and the gate, the wiring connection complexity, the area of the delay circuit, and the fabrication process steps may be advantageously reduced.

In some embodiments, the second transistor $T_0$ may be designed to substantially replicate the transistor $M_0$, and/or may be on the same die and have the same type and substantially the same size as the transistor $M_0$. The leakage current of the transistor $M_0$ may be substantially exactly matched (e.g., dimensionally) across process, voltage, and temperature. In some embodiments, the position of the second transistor $T_0$ may be arranged higher than the position of the transistor $M_0$. In some embodiments, the added capacitance of the second transistor $T_0$ may be compensated by reducing the capacitance value of $C_0$.

By introducing the second transistor $T_0$ in the delay circuit 405a, the voltage $V_{b0H}$ at the second node $b_0$ is kept constant. $V_{b0H}=(V_{dda}*C_0)/(C_0+C_{b0})$, where $C_{b0}$ is the parasitic capacitance of the transistor $M_0$.

Figure 4B:
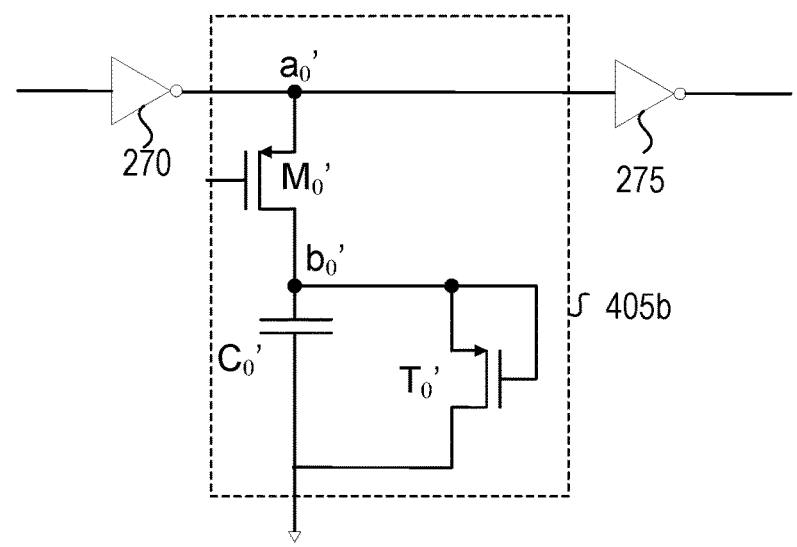
FIG. 4B depicts another exemplary switch leakage compensation delay circuit.

FIG. 4B depicts another exemplary switch leakage compensation delay circuit. A delay circuit 405b includes a first capacitor $C_0'$. The first capacitor $C_0'$ is arranged between a reference node (e.g., ground potential) and a second node $b_0'$. The first capacitor $C_0'$ is used to introduce a predetermined delay on an incoming sampling clock signal delivered to the first node $a_0'$. In some embodiments, the capacitor $C_0'$ may be a MOS capacitor for precision and lesser area.

The other end of the capacitor $C_0'$ is connected with a first transistor $M_0'$ through the second node $b_0'$. In this depicted example, the first transistor $M_0'$ is a P-channel metal-oxide-semiconductor field-effect transistor (PMOSFET). In some embodiments, the first transistor $M_0'$ may be a transmission gate. The delay circuit 405b also includes a second transistor $T_0'$. In this depicted example, the second transistor $T_0'$ is a PMOSFET. In some embodiments, the second transistor $T_0'$ may be a transmission gate as both supply and ground needs to be passed to the capacitor in the rising and falling edge respectively. In practice, due to subthreshold effect, the second transistor $T_0'$ in the delay circuit 405b may introduce a leakage current that may be used to compensate a leakage current that is provided by the first transistor $M_0'$. Such that, the voltage $V_{b0H}$ at the second node $b_0'$ is kept constant.

Figure 4C:
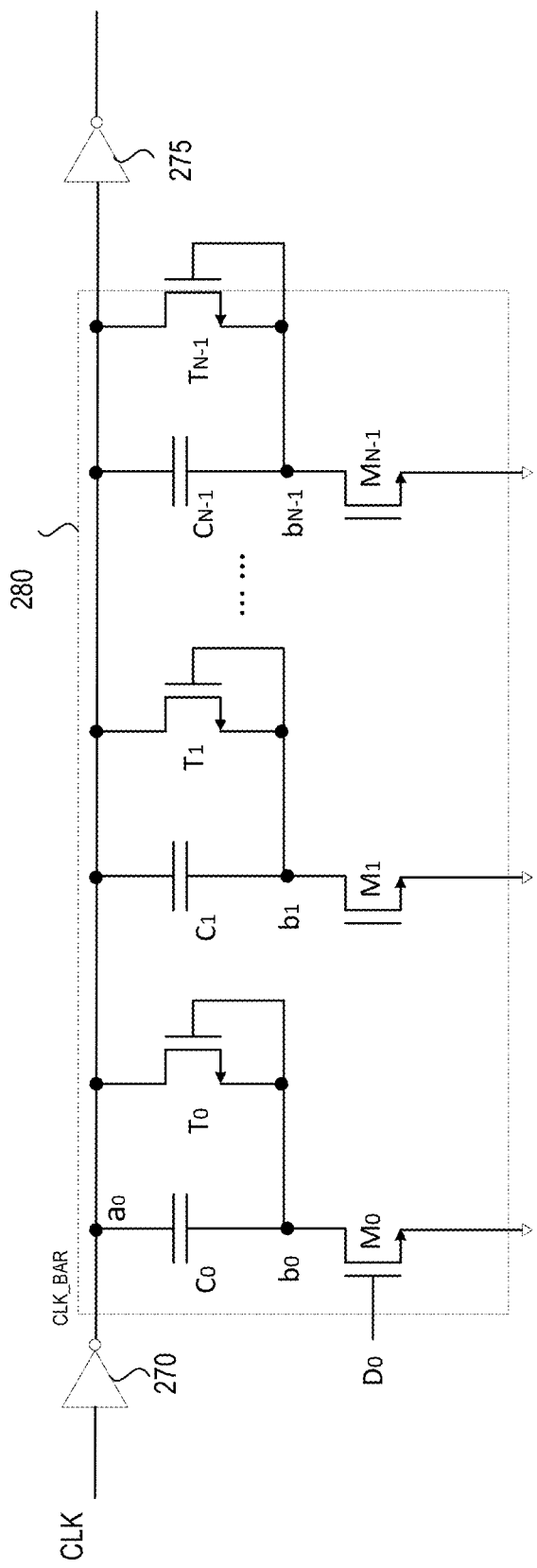
FIG. 4C depicts an exemplary switch leakage compensation delay system implemented in the FIG. 2.

FIG. 4C depicts an exemplary switch leakage compensation delay system implemented in FIG. 2. The switch leakage compensation delay system 280 includes at least one delay circuit 405a connected in parallel. In each delay circuit 405a, the switches $M_0, M_1, \ldots, M_{N-1}$ are respectively controlled by binary voltage signals $D_0, D_1, \ldots, D_{N-1}$. By controlling the binary voltage signals $D_0, D_1, \ldots, D_{N-1}$ respectively applied to the gates of the switches $M_0, M_1, \ldots, M_{N-1}$, a programmable delay may be obtained. The leakage current introduced by switches $M_0, M_1, \ldots, M_{N-1}$ may be respectively compensated by the transistors $T_0, T_1, \ldots, T_{N-1}$. When some of $M_0, M_1, \ldots, M_{N-1}$ are on, the buffer 270 may be loaded by corresponding off transistors ($T_0, T_1, \ldots, T_{N-1}$). The on resistance of the buffer 270 may be low as it needs to meet the jitter specification or transition times in all the systems where a Time Skew DAC is implemented.

In some embodiments, the switch leakage compensation delay system 280 may include at least one the delay circuit 405b connected in parallel. The switches $M_0', M_1', \ldots, M_{N-1}'$ may be respectively controlled by binary voltage signals $D_0', D_1', \ldots, D_{N-1}'$. By controlling the binary voltage signals $D_0', D_1', \ldots, D_{N-1}'$ respectively applied to the gates of the switches $M_0', M_1', \ldots, M_{N-1}'$, a programmable delay may be obtained. The leakage current introduced by switches $M_0', M_1', \ldots, M_{N-1}'$ may be respectively compensated by the transistors $T_0', T_1', \ldots, T_{N-1}'$.

Figure 5A:
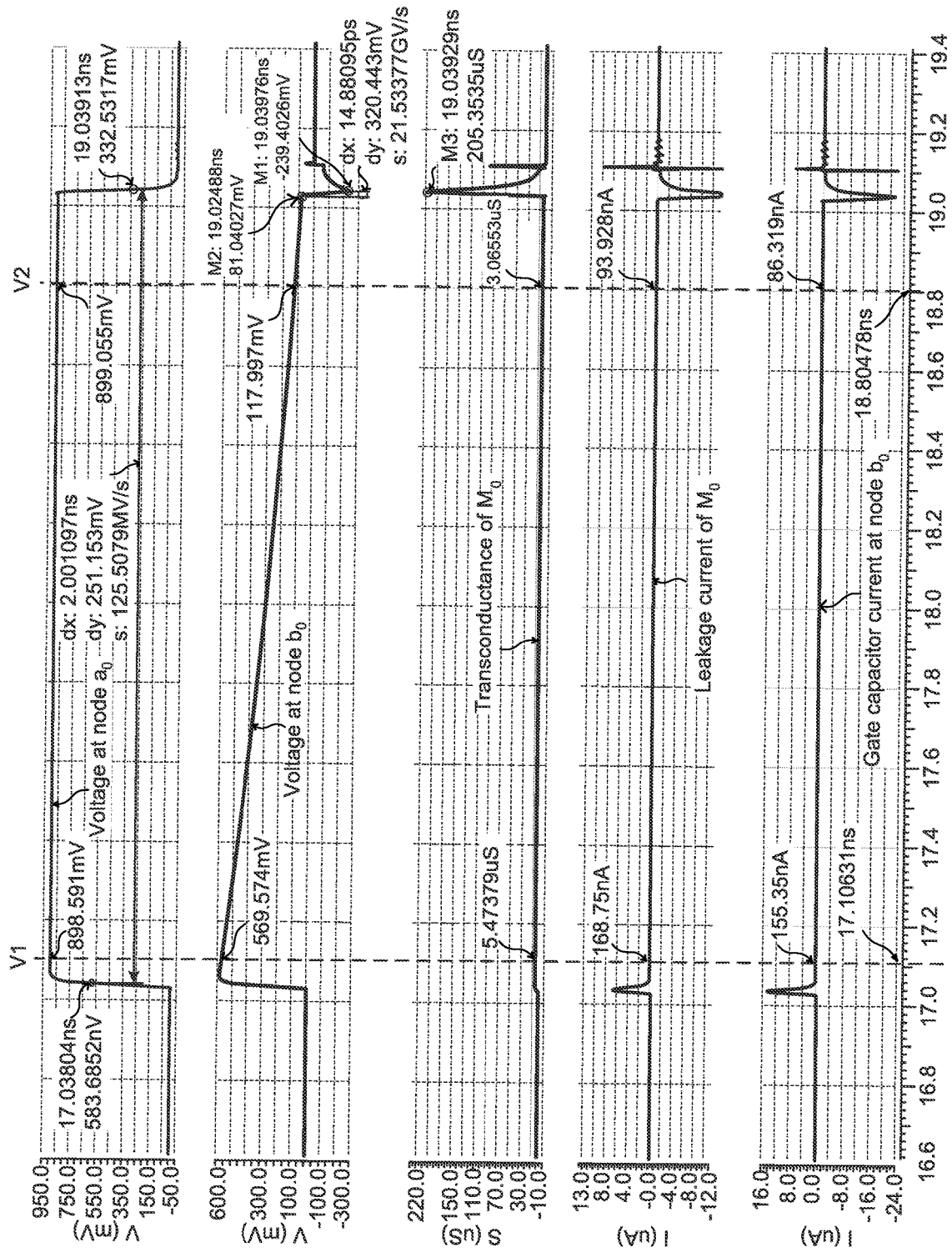
FIG. 5A depicts an exemplary experimental result showing time diagrams of the delay circuit in FIG. 3C.

FIG. 5A depicts an exemplary experimental result showing time diagrams of the delay circuit in FIG. 3C. In this experiment, an ADC having a 125 MSPS sample rate is tested at a fast fast (FF) corner. The duration of sampling pulses is about 2 ns. The falling edge of the sampling clock is of interest. The leakage current of the switch $M_0$ is detected at 110° C. The threshold of the switch $M_0$ is 0.25 V. As shown in the FIG. 5A, there is a significant drop after 2 ns which leads to a negative spike on voltage at node $b_0$ at the end of 2 ns and a positive spike on the transconductance of the transistor $M_0$. The transconductance of $M_0$ rises to 205 uS (about 5 k Ohm) while the voltage at $a_0$ falls from 0.9V to 0V. Because of this low resistance value of the transistor $M_0$, the transistor $M_0$ conducts and the capacitor $C_0$ gets connected between $a_0$ and ground through a 5 k resistor.

Figure 5B:
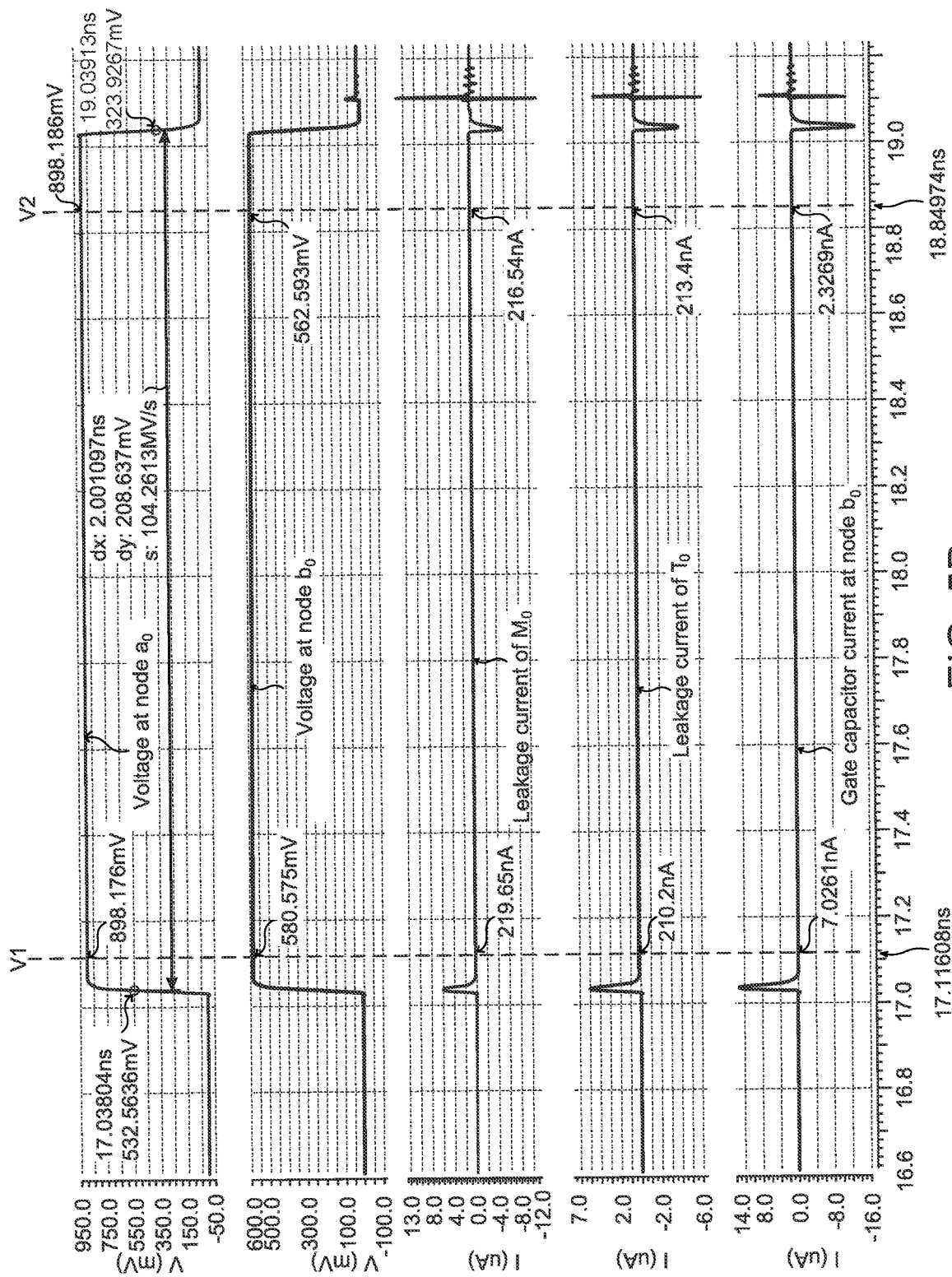
FIG. 5B depicts an exemplary experimental result showing time diagrams of the switch leakage compensation delay circuit in FIG. 4C.

FIG. 5B depicts an exemplary experimental result showing time diagrams of the switch leakage compensation delay circuit in FIG. 4C. In this experiment, an ADC having a 125 MSPS sample rate is tested at a fast fast (FF) corner. The duration of sampling pulses is about 2 ns. The falling edge of the sampling clock is of interest here. The leakage current of the switch $M_0$ and the leakage current of the switch $T_0$ are detected at 110° C. The threshold voltage of the switch $M_0$ is 0.25V. As shown in the FIG. 5B, there is very little, if any, drop after 2 ns and there is no negative spike at the end of 2 ns. The leakage current of the switch $M_0$ is nearly the same as the leakage current of the switch $T_0$. Such that the leakage current of the switch $M_0$ may be cancelled by the leakage current of the switch $T_0$.

FIG. 6A depicts an exemplary simulation result of the delay circuit in FIG. 3C. In this simulation, a basic unit cell of the time skew DAC is designed to give 8 fs step for end of sampling. Each sub-ADC runs at 625 MSPS (overall ADC at 5GSPS, interleaving by 8) having a sampling period of 200 ps. A 100-point Monte-Carlo simulation is done at 125 MSPS (⅕$^{th}$ of full speed). As shown in the table, the maximum start of sampling is 10.08 fs and the maximum end of sampling is 21.79 fs. The sampling end point may be significantly affected by the leakage current of the switch $M_0$. The Max step value goes more than twice due to many off units are getting turned on, which may lead to missing time steps.

FIG. 6B depicts an exemplary simulation result of the switch leakage compensation delay circuit in FIG. 4C. Under the same simulation environment, by using the delay system as shown in FIG. 4C, the maximum end of sampling is 11.43 fs, which is significantly less than the 21.79 fs in FIG. 6A. Such that the mismatch that caused by switch leakage may be solved.

Figure 7:
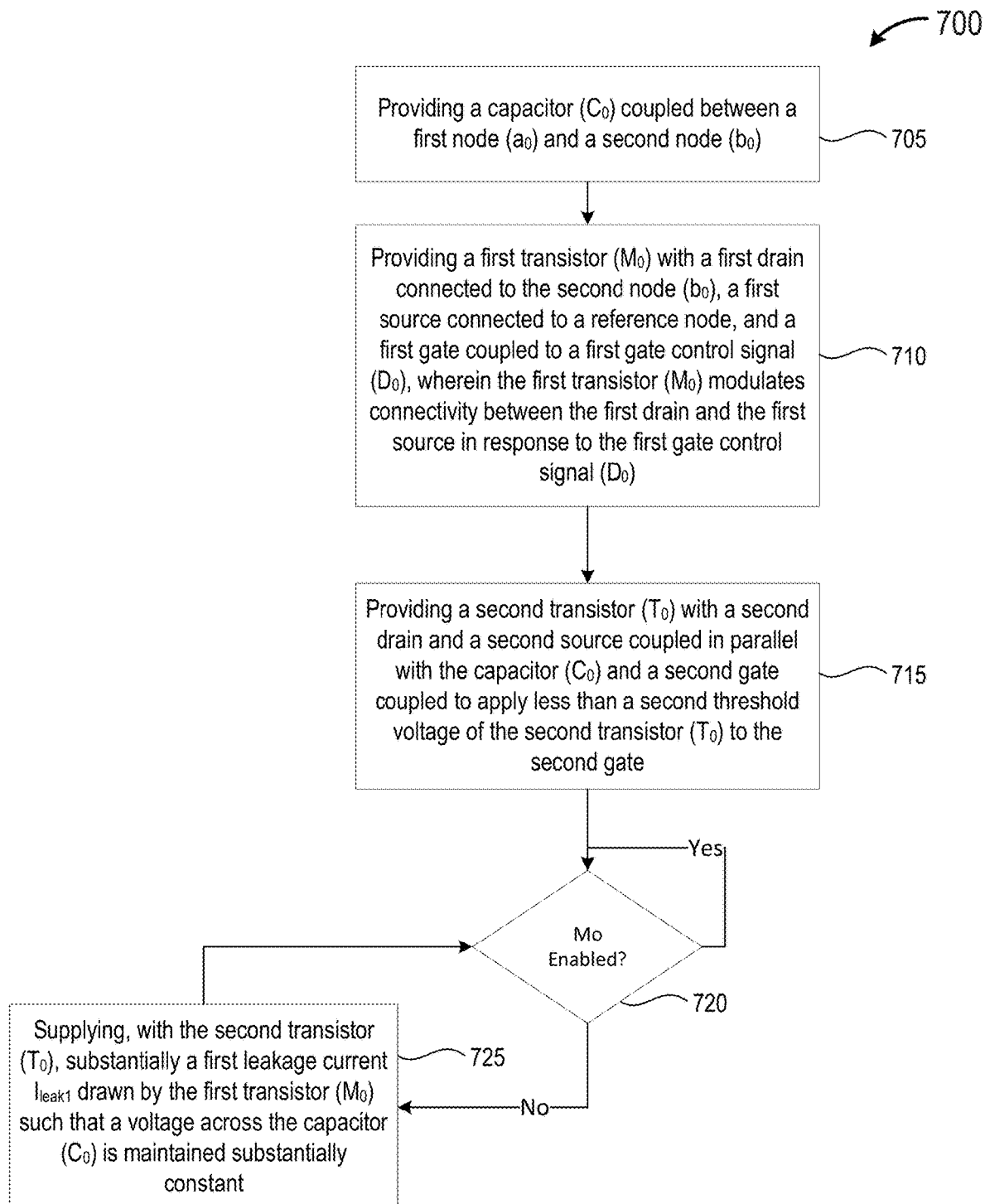
FIG. 7 depicts a flow chart of an exemplary method to perform switch leakage compensation.

FIG. 7 depicts a flow chart of an exemplary method to perform switch leakage compensation. A method 700 to compensate switch leakage includes, at 705, providing a capacitor (e.g., $C_0$) coupled between a first node (e.g., $a_0$) and a second node (e.g., $b_0$). The method 700 also includes, at 710, providing a first transistor (e.g., $M_0$) with the drain of the first transistor $M_0$ connected to the second node ($b_0$), the source of the first transistor $M_0$ connected to a reference node, and the gate of the first transistor $M_0$ coupled to a first gate control signal (e.g., $D_0$). The first transistor $M_0$ modulates connectivity between the drain and the source of the first transistor $M_0$ in response to the first gate control signal $D_0$.

The method 700 also includes, at 715, providing a second transistor (e.g., $T_0$) with the drain and the source of the second transistor $T_0$ coupled in parallel with the capacitor ($C_0$), and the gate of the second transistor $T_0$ is coupled to apply less than a second threshold voltage of the second transistor ($T_0$) to the gate the second transistor $T_0$. At 720, whether the first transistor $M_0$ is enabled or not is dynamically monitored. If the first transistor $M_0$ is enabled by the first gate control signal $D_0$, then, the method 700 also includes, at 725, supplying, with the second transistor ($T_0$), substantially a first leakage current $I_{leak1}$ drawn by the first transistor $M_0$ such that a voltage across the capacitor $C_0$ is maintained substantially constant.

Although various embodiments have been described with reference to the figures, other embodiments are possible. For example, the second node $b_0$ may be connected to $V_{dda}$ through a resistance. In some embodiments, the switch $M_0$, $M_1, \ldots M_{N-1}$ may be replaced by transistors with high threshold voltages. In some embodiments, the length of the $M_0, M_1, \ldots, M_{N-1}$ may be increased.

In some embodiments, the delay circuit may be used to other systems. For example, in a voltage-controlled-delay line (VCDL), transistors may be used as switches. Another transistor may be introduced to compensate the leakage current provided by the transistors in the VCDL.

Although various embodiments may be implemented using reconfigurable programmable logic blocks (e.g., FPGA), other embodiments may be implemented in fixed instantiations (e.g., ASIC). While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

Various examples of delay circuits may be implemented using circuitry, including various electronic hardware. By way of example and not limitation, the hardware may include transistors, resistors, capacitors, switches, integrated circuits and/or other circuits. In various examples, the delay circuits may include analog and/or digital logic, discrete components, traces and/or memory circuits fabricated on a silicon substrate including various integrated circuits (e.g., FPGAs, ASICs, SoCs). In some embodiments, the delay circuits may involve execution of preprogrammed instructions and/or software executed by a controlling circuit. For example, a controlling circuit may be used to generate predetermined control signals to control switches in the delay circuits.

In various implementations, the communication system may communicate using suitable communication methods, equipment, and techniques. For example, the system may communicate with compatible devices (e.g., devices capable of transferring data to and/or from the system) using point-to-point communication in which a message is transported directly from a source to a receiver over a dedicated physical link (e.g., fiber optic link, infrared link, ultrasonic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A delay circuit comprising:
a capacitor coupled between a first node and a second node;
a first transistor with a first drain connected to the second node, a first source connected to a reference node, and a first gate coupled to a first gate control signal, wherein the first transistor modulates connectivity between the first drain and the first source in response to the first gate control signal; and,
a second transistor with a second drain and a second source coupled in parallel with the capacitor and a second gate coupled to apply less than a second threshold voltage of the second transistor to the second gate, wherein, in a first mode, when the first gate control signal applies less than a first threshold voltage of the first transistor to the first gate, a voltage across the capacitor is substantially constant.

2. The delay circuit of claim 1, wherein in the first mode, the first transistor provides a first leakage current $I_{leak1}$ that substantially matches a second leakage current $I_{leak2}$ provided by the second transistor.

3. The delay circuit of claim 1, wherein the second drain is connected to the first node, and the second source is connected to the second gate and to the second node.

4. The delay circuit of claim 1, wherein a potential of the reference node comprises a circuit ground potential.

5. The delay circuit of claim 1, wherein the second gate is connected to the second node.

6. The delay circuit of claim 1, wherein the second transistor is on the same die and has substantially the same dimensions as the first transistor.

7. The delay circuit of claim 1, wherein the first transistor comprises an n-channel metal-oxide-semiconductor field-effect transistor (NMOSFET).

8. The delay circuit of claim 1, wherein the first transistor comprises a p-channel metal-oxide-semiconductor field-effect transistor (PMOSFET).

9. The delay circuit of claim 1, wherein the first transistor comprises a transmission gate.

10. The delay circuit of claim 1, wherein the capacitor comprises a metal-oxide-semiconductor transistor.

11. The delay circuit of claim 1, wherein, for each of the at least one delay circuits, the second drain is connected to the first node, and the second source is connected to the corresponding second gate and to the corresponding second node.

12. The delay circuit of claim 1, wherein a potential of the reference node comprises a circuit ground potential.

13. The delay circuit of claim 1, wherein the second gate is connected to the second node.

14. A system, comprising:
a buffer output coupled to drive a first node providing a predetermined delay on an input clock signal; and,
at least one delay circuit configured to obtain the predetermined delay, each of the at least one delay circuits comprising:
- a capacitor coupled between the first node and a corresponding second node;
- a first transistor with a first drain connected to a respective one of the second nodes, a first source connected to a reference node, and a first gate coupled to a corresponding first gate control signal, wherein the first transistor modulates connectivity between the corresponding first drain and the corresponding first source in response to the corresponding first gate control signal; and,
- a second transistor with a second drain and a second source coupled in parallel with the corresponding capacitor and a corresponding second gate coupled to apply less than a second threshold voltage of the second transistor to the second gate, wherein, in a first mode, when the first gate control signal applies less than a first threshold voltage of the corresponding first transistor to the first gate, a voltage across the corresponding capacitor is substantially constant.

15. The system of claim 14, wherein, in the first mode, for each of the at least one delay circuits, each of the first transistors provides a corresponding first leakage current $I_{leak1}$ that substantially matches a corresponding second leakage current $I_{leak2}$ provided by the corresponding second transistor.

16. A method comprising:
providing a capacitor coupled between a first node and a second node;
providing a first transistor with a first drain connected to the second node, a first source connected to a reference node, and a first gate coupled to a first gate control signal, wherein the first transistor modulates connectivity between the first drain and the first source in response to the first gate control signal;
providing a second transistor with a second drain and a second source coupled in parallel with the capacitor and a second gate coupled to apply less than a second threshold voltage of the second transistor to the second gate; and,
when, in a first mode, the first gate control signal applies less than a first threshold voltage of the first transistor to the first gate, supplying, with the second transistor, substantially a first leakage current $I_{leak1}$ drawn by the first transistor such that a voltage across the capacitor is maintained substantially constant.

17. The method of claim 16, wherein in the first mode, the second transistor substantially matches the first leakage current $I_{leak1}$.

18. The method of claim 16, wherein the second drain is connected to the first node, and the second source is connected to the second gate and to the second node.

19. The method of claim 16, wherein a potential of the reference node comprises a circuit ground potential.

20. The method of claim 16, wherein the second gate is connected to the second node.

* * * * *